United States Patent
Brewster et al.

(10) Patent No.: US 9,464,667 B2
(45) Date of Patent: Oct. 11, 2016

(54) MAGNETIC BEARING ASSEMBLY FORMED BY MEASURING FIRST AND SECOND ORDER TRANSVERSE STRAY MAGNETIC FIELDS

(75) Inventors: Barrie Dudley Brewster, Brighton (GB); Andrew Waye, Forest Row (GB)

(73) Assignee: Edwards Limited, Burgess Hill, West Sussex (GB)

( * ) Notice: Subject to any disclaimer, the term of this patent is extended or adjusted under 35 U.S.C. 154(b) by 468 days.

(21) Appl. No.: 14/112,457

(22) PCT Filed: May 4, 2012

(86) PCT No.: PCT/GB2012/050975
§ 371 (c)(1),
(2), (4) Date: Oct. 17, 2013

(87) PCT Pub. No.: WO2012/153109
PCT Pub. Date: Nov. 15, 2012

(65) Prior Publication Data
US 2014/0035412 A1 Feb. 6, 2014

(30) Foreign Application Priority Data
May 6, 2011 (GB) .................................. 1107587.6

(51) Int. Cl.
*G01B 7/30* (2006.01)
*F16C 32/04* (2006.01)
(Continued)

(52) U.S. Cl.
CPC ............ *F16C 32/04* (2013.01); *F16C 32/0425* (2013.01); *G01R 33/1215* (2013.01); *F16C 43/00* (2013.01); *G01P 3/487* (2013.01); *H01F 7/0236* (2013.01); *Y10T 29/49004* (2015.01)

(58) Field of Classification Search
CPC .. H01F 7/0236; H01F 41/0253; F16C 32/04; F16C 32/0425; F16C 43/00; G01R 33/1215; Y10T 29/49004

USPC .................. 324/202–205, 207.25, 174, 244, 324/260–262
See application file for complete search history.

(56) References Cited

U.S. PATENT DOCUMENTS 6,448,679 B1 * 9/2002 Imlach .................... F16C 27/06
310/10
2002/0074881 A1 6/2002 Imlach
(Continued)

FOREIGN PATENT DOCUMENTS

| CN | 1466768 A | 1/2004 |
|---|---|---|
| DE | 3032938 A1 | 4/1982 |

(Continued)

OTHER PUBLICATIONS

Form Translation for First Office Action from the Chinese Patent Office dated Jun. 3, 2015 for corresponding Application No. CN2012800219910 filed May 4, 2012.
(Continued)

*Primary Examiner* — Jay Patidar
(74) *Attorney, Agent, or Firm* — Theodore M. Magee; Westman, Champlin & Koehler, P.A.

(57) ABSTRACT

Stray magnetic fields created by non-symmetrical magnetisation of the permanent magnets in a rotating magnet array of a magnetic bearing assembly, when used in turbo molecular pumps, can cause significant problems to devices such as scanning electron microscopes. In order to minimise the stray fields, at least the dipole and quadrupole moments of each magnet in the array is first measured. The magnets in the array are then arranged relative to one another such that both the dipole and quadrupole moments are minimised, thus minimising the stray magnetic field when the magnet array rotates in the turbomolecular pump.

5 Claims, 9 Drawing Sheets

(51) Int. Cl.
*G01R 33/12* (2006.01)
*G01P 3/487* (2006.01)
*H01F 7/02* (2006.01)
*F16C 43/00* (2006.01)

(56) References Cited

U.S. PATENT DOCUMENTS

| 2004/0189123 A1 | 9/2004 | Nusser |
| 2004/0234397 A1 | 11/2004 | Wampler |
| 2009/0039995 A1 | 2/2009 | Kip |

FOREIGN PATENT DOCUMENTS

| DE | 19607841 A1 | 9/1997 |
| DE | 10022061 A1 | 11/2001 |
| EP | 1477695 A2 | 11/2004 |
| JP | S57116933 A | 7/1982 |

OTHER PUBLICATIONS

Translation of First Office Action from the Chinese Patent Office dated Jun. 3, 2015 for corresponding Application No. CN2012800219910 filed May 4, 2012.
Search Report from the Chinese Patent Office dated Jun. 3, 2015 for corresponding Application No. CN2012800219910 filed May 4, 2012.
International Search Report dated Nov. 6, 2012 for corresponding Application No. PCT/GB2012/050975, filed May 4, 2012.
International Written Opinion dated Nov. 6, 2012 for corresponding Application No. PCT/GB2012/050975, filed May 4, 2012.
UK Search Report dated Sep. 27, 2011 for corresponding Application No. GB1107587.6, filed May 6, 2011.

\* cited by examiner

MAGNETIC BEARING ASSEMBLY FORMED BY MEASURING FIRST AND SECOND ORDER TRANSVERSE STRAY MAGNETIC FIELDS

CROSS-REFERENCE TO RELATED APPLICATION

This Application is a Section 371 National Stage Application of International Application No. PCT/GB2012/050975, filed May 4, 2012, which is incorporated by reference in its entirety and published as WO 2012/153109 A2 on Nov. 15, 2012 and which claims priority to British Application No. 1107587.6, filed May 6, 2011.

BACKGROUND

The present disclosure relates to the field of magnetic bearings. In particular an apparatus and method for reducing stray transverse magnetic fields caused by permanent magnetic bearing arrangements in high speed rotary machines such as turbomolecular pumps.

Turbomolecular pumps are employed as part of the vacuum system used to create the high vacuum environment required for devices such as scanning electron microscopes (SEMS) and lithography devices.

It is common for turbomolecular pumps to comprise an oil free passive permanent magnetic bearing arrangement in the high vacuum end of the pump.

Figure 1:
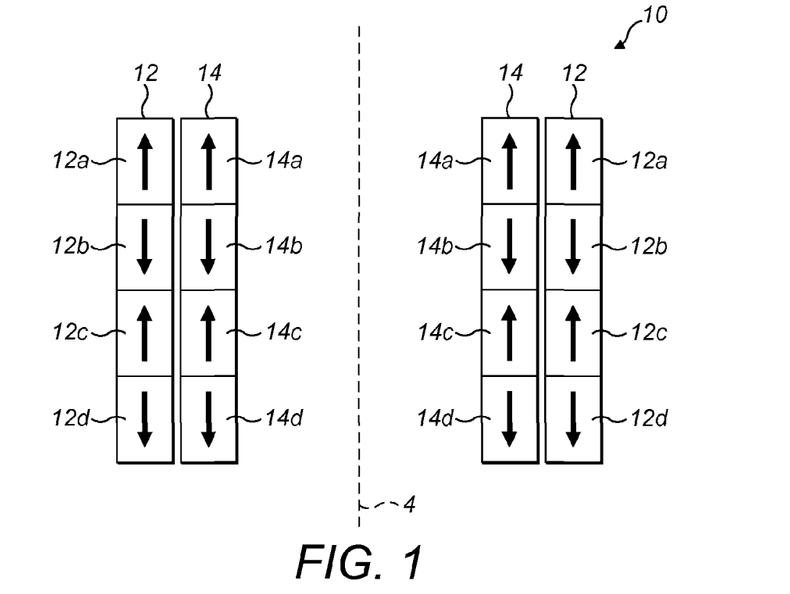
FIG. 1 is a cross sectional illustration of a passive magnetic bearing arrangement.

A cross section of a passive permanent magnetic bearing arrangement 10 for a turbomolecular pump (not shown) is illustrated in FIG. 1. In this example the bearing arrangement 10 comprises an array 12 of four outer rotating permanent magnet rings 12a, 12b, 12c and 12d and an array 14 of four inner non-rotating permanent magnetic rings 14a, 14b, 14c and 14d arranged such that the outer, rotating, array 12 surrounds the inner, static, array 14 in a concentric manner. The magnets are all formed of rare earth magnetic material. The outer array 12 is attached to the rotor of a turbomolecular pump (not shown) with the static array 14 attached to the stator of said pump. For reasons of mechanical strength and practical construction, it is normal for the outer array of rings to form the rotating part of the bearing arrangement and the inner rings to form the stationary part.

In this example the magnetisation of the magnetic rings 12a to 12d and 14a to 14d in each array 12, 14 respectively is substantially aligned with the axis of rotation 4 of the pump rotor (not shown). The direction of magnetisation has been indicated by the arrows, with the head of each arrow indicating the north pole.

The magnets are arranged within each array such that they are in mutual repulsion with each other; that is proximate magnets in an array meet their nearest neighbouring magnet in the same array with the same pole (e.g. magnets 12a and 12b meet each other with their south poles). The outer magnetic rings 12a, 12d, 14a, 14d in each array have their north poles facing outermost.

The magnets 12a to 12d and 14a to 14d in each array 12, 14 of the arrangement 10 are orientated to provide a mutual repulsion between the arrays 12, 14 and therefore create an almost frictionless bearing.

A great many other configurations are possible, using different numbers of rings, with axial or radial magnetisation, and arranged for either repulsive or attractive forces between rotor and stator. Although a variety of configurations are possible, they all perform optimally when the direction of magnetisation in the rings is perfectly symmetrical with respect to their geometric axis.

Figure 2A:
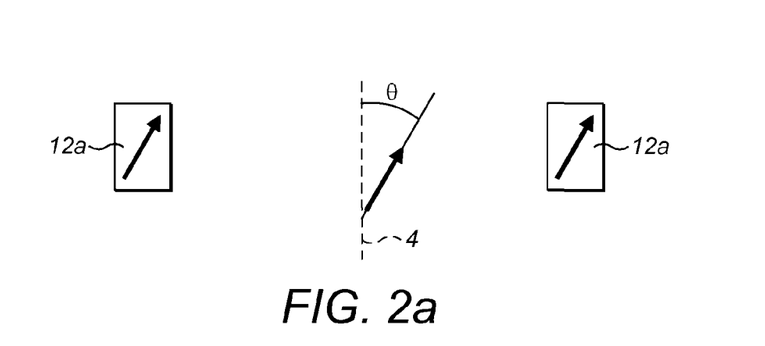
FIG. 2a is an illustration of the asymmetric magnetisation of a permanent ring magnet.
Figure 2B:
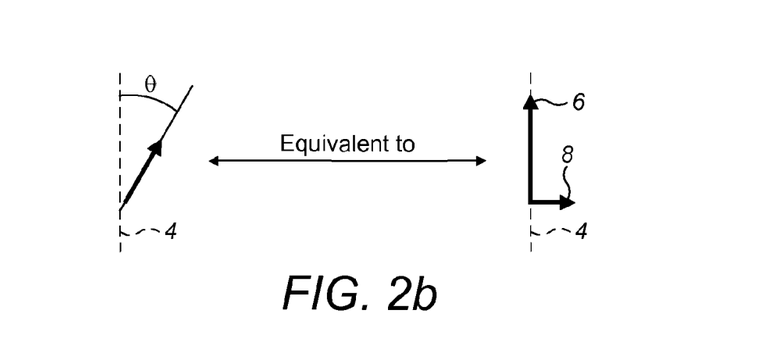
FIG. 2b is an illustration of the asymmetric magnetisation of a permanent ring magnet.

The magnetisation in the rings 12a to 12d of the rotating array 12 is shown in FIG. 1 as perfectly symmetrical with respect to their geometric axis 4. However, in reality, the magnetisation of each magnetic ring 12a to 12d (and, similarly, for magnets 14a to 14d) is imperfect due to the practical limitations of their manufacturing process. This is illustrated in FIGS. 2a and 2b. The largest magnetic asymmetry observed in axially magnetised permanent magnetic rings is usually a small angular error such that the magnet's axis is displaced from the geometric axis 4 by an angle of a few degrees as indicated in FIG. 2a. Depending on the quality, or grade, of the magnet the angular error, θ, can be as much as 3°. This error may be regarded as a small perturbation from the ideal axial magnetisation; in effect a transverse magnetic dipole moment 8 superimposed on the intended axial dipole moment 6 as illustrated in FIG. 2b.

In addition to the transverse dipole (first order) asymmetry, higher order asymmetries exist, for example quadrupole and hexapole asymmetries. The magnitude, or magnetic field strength, of the asymmetry usually decreases as the number of poles increases.

Where these small asymmetries occur in any of the rings 12a to 12d of the rotating magnet array 12, a time varying magnetic field is generated (the magnetic field is constant for the static magnets 14a to 14d). These 2, 4 and 6 pole asymmetries generate time varying magnetic fields at frequencies of 1, 2, 3 times the rotational speed of the pump rotor respectively.

The performance of scanning electron microscopes is highly susceptible to mechanical vibrations or stray magnetic fields emitted from turbomolecular pumps. The stray fields are known to directly interfere with the electron beam or with the instruments' electrical circuits.

Although it common to use ferromagnetic shielding to reduce such magnetic field emissions, such shielding is costly and is only of limited effectiveness.

Therefore it is desirable to reduce the effect of these time-varying stray magnetic fields by alternative means.

The discussion above is merely provided for general background information and is not intended to be used as an aid in determining the scope of the claimed subject matter. The claimed subject matter is not limited to implementations that solve any or all disadvantages noted in the background.

SUMMARY

A first aspect provides a method of assembling a rotating magnet array for a permanent magnet bearing arrangement, said rotating array comprising at least four permanent ring magnets, the method comprising the steps of:
  measuring the size and phase (vectors) of at least the first and second order transverse stray magnetic fields, namely the transverse dipole and quadrupole stray fields, of at least four ring magnets individually in relation to a reference point on said ring magnets;
  calculating, or computing, the relative angular orientation and relative magnetic polarity direction of each of said at least 4 magnets within the array that, when the array is assembled, will provide the minimum time-varying magnetic field; and
  assembling the array of magnets according to said calculation.

By optimal selection and assembly of the magnet rings, the asymmetrical magnetisation of the several rotating rings is substantially mutually counteracted. By calculating the effects of all permutations of the magnets in the "up" and "down" orientations, and all their relative angular orientations, it is possible to determine the optimum configuration of the magnets for minimising the majority of the stray magnetic field.

A measurement on the set of magnets in the preferred orientation and permutation according to the calculation to determine the stray field and/or the measurement of stray fields on the finished array can then be carried out.

Other preferred and/or optional aspects of the invention are defined in the accompanying claims.

The Summary is provided to introduce a selection of concepts in a simplified form that are further described in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

In order that the present invention may be well understood, embodiments thereof, which are given by way of example only, will now be described with reference to the accompanying drawings, in which.

DETAILED DESCRIPTION

Figure 3:
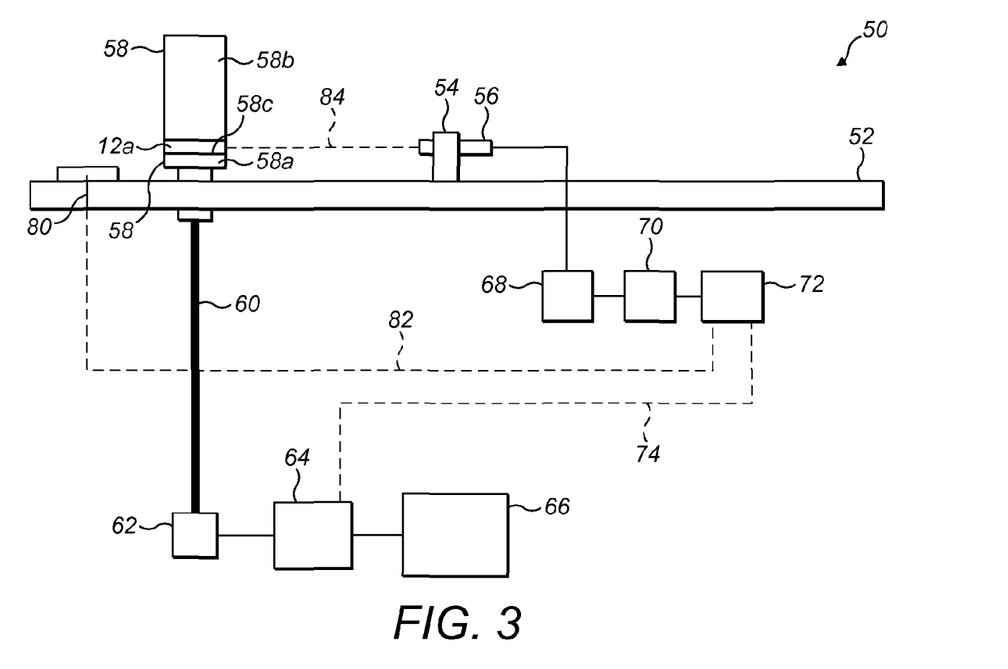
FIG. 3 is a schematic representation of an apparatus for carrying out the measurement according to various embodiments.

FIG. 3 is a schematic of an apparatus for carrying out the measurement according to various embodiments. The magnet measuring station (or magnetic alignment rig) 50 comprises a magnet rotation section 58, 60, 62, 64, 66 and a magnetic field measuring section 56, 54, 68, 70, 72.

The magnet rotation section comprises a motor 62, for spinning the magnet. The motor 62 is driven by a speed control device 64, such as an inverter, and a power supply 66. A non magnetic spindle, or rotor, 60 attached to the motor 62 extends up through a non magnetic bench 52 to a magnet holder 58 (also non magnetic). The motor is positioned sufficiently far away from the magnet holder and measuring station that any magnetic fields emitted from said motor 62 do not interfere with any measurements taken. The rotor is preferably supported by a non-magnetic bearing arrangement (not shown) at the end distal from the motor, proximate to the magnet holder 58 to ensure the magnet is able to spin substantially free of vibration or movement. The magnet holder 58 comprises a base 58a, attached to the spindle 60, and an axial clamping arrangement 58b. The base 58a comprises a substantially flat surface 58c, upon which the ring magnet 12a is received, preferably with a central shaft (not shown) extending upwardly from the base. The shaft is substantially the same diameter as the inner circumference of the ring magnet so that the magnet is prevented from moving radially during rotation. The axial clamping arrangement 58b comprises an inner bore, also substantially matching the diameter of the central shaft. The clamping arrangement 58b preferably attaches to the base 58a with a screw thread arrangement. A phase reference pickup device 80 is also provided to detect the angular position of the spindle during rotation. The pickup 80 may use, for example, an optical trigger such as a datum or reference line on the base 58a. The pickup is in communication with a computer 72.

The magnetic field measuring section comprises a magnetic field measuring device 56 supported on the bench 52 by a non magnetic support 54. The measuring device 56 may be a flux gate sensor, hall-effect sensor or a search coil with a sensitivity capable of resolving 1 nT with less than 500 pT noise. The sensor 56 is connected to a signal conditioning device 68, a fast Fourier transform order tracking device 70 and a computer 72. The computer 172 is provided with software to compute the preferred configuration and/or permutation of the magnets based on the measurements taken for each magnet.

In use, the individual magnet to be measured 12a is placed on the magnet holder base 58a, positioned with the north pole directed downwards. A reference point, which can simply be a mark made by a pen, is placed on the ring magnet 12a to match to a reference datum line on the base 58a. The magnet 12a is then fixed in this position to the magnet holder with clamping arrangement 58b.

The magnet 12a and sensor 56 should be aligned such that the sensor axis 84 is substantially aligned with the equator of the outer circumference of the magnet 12a (i.e. midway between its north and south pole).

To characterise the magnetic field of each magnet, the motor 62 is rotated, which spins the magnet 12a via the spindle 60 and magnet holder 58. The motor runs between 21 Hz to 24 Hz. The spindle 60 and magnet holder 58 should repeatably orientate magnet(s) such that the axis of the magnetic field sensor 56 lies in the plane of the magnet (i.e. orthogonal to the nominal magnetisation axis) to <1°. The (axial) run-out of the magnet abutment face on the rotating shaft 60 and holder 58a should be <10 μm (1 μm run-out or 0.0019° magnet tilt is equivalent to 0.6 nT error).

The sensor 56, in combination with the pickup 80, a signal conditioner 68, a fast Fourier transform analyser 70, and a computer 72 detects and records the magnitude and phase data of the magnet's transverse magnetic fields. At least the first and second order transverse stray magnetic fields, namely the transverse dipole and quadrupole stray fields, should be measured and recorded for each magnet. However higher order multi pole transverse fields, such as hexapole, data may also be collected.

If the process is being carried out for a rotating magnet array 12 for a permanent magnetic bearing arrangement 10 comprising at least four magnets this process is repeated for at least three other magnets 12b, 12c, 12d. The data is collected for each magnet over at least 20 seconds of rotation.

The relative angular orientation (compared to the reference point made on each magnet during the measurement step) and relative magnetic polarity direction of each of the four magnets 12a, 12b, 12c, 12d within the array 12 is then calculated that will provide an assembled array 12 with minimum time-varying magnetic field during rotation.

Figure 4:
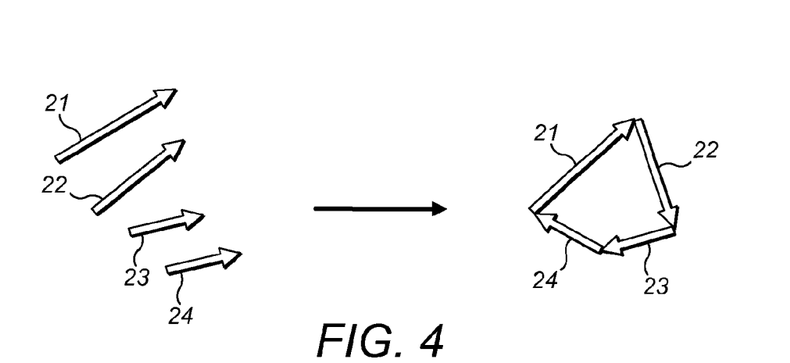
FIG. 4 is an illustration of a reduced stray transverse dipole moment magnetic field of a four ring magnet system

As illustrated in FIG. 4, if the calculation is confined to reducing just the stray transverse dipole, or first order, magnetic field, in an array of 4 rotating magnet rings, the vector addition of the 4 transverse dipole moments (21, 22, 23, 24) of the 4 magnet rings need only be considered. By rotating the 4 rings relative to each other in the array it is possible to create a relative angular orientation of the magnets in which the 4 individual dipole moments (21, 22, 23, 24) form a closed quadrilateral and thus have a zero vector sum (as long as no individual magnet has a dipole moment greater than the sum of the other three magnets). It is possible to form this quadrilateral in several relative angular orientations ways and still achieve the zero vector sum. The arrangement of 4 ring magnets to providing zero total dipole is said to have one degree of freedom.

A rotating magnet array of a magnetic bearing with 3 rotating magnets in each array can also be arranged to form a closed triangle (depending on the relative magnitude of the 3 vectors), but there is only one relative orientation, and so has no degrees of freedom. In general an N-magnet system can be assembled for minimum dipole moment with N-3 degrees of freedom.

Figure 5:
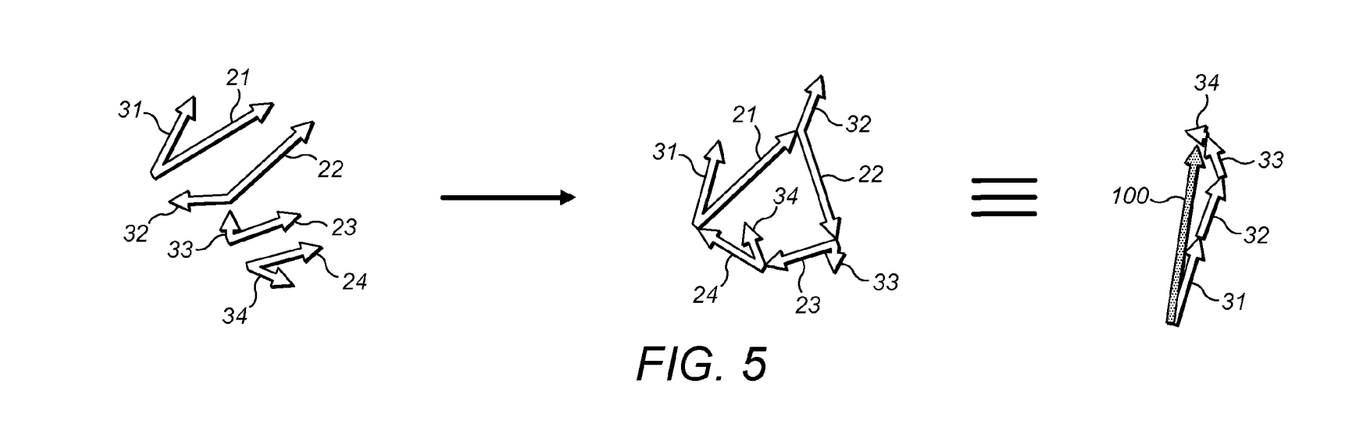
FIG. 5 is an illustration of a stray transverse dipole and quadrupole moment magnetic field of a four ring magnet system.

When the time-varying field due to second order, quadrupole moments, stray fields are then considered in addition to dipole moments, it is found that there is no particular relationship between the direction of the quadrupole and dipole moments, so that satisfying a zero vector sum of dipole moments does not generally produce a zero sum of quadrupole moment. Whereas a 4-magnet configuration gave 1 degree of freedom for dipole only, there are less than zero degrees of freedom for achieving a zero sum of both dipole and quadrupole because the problem is over-constrained. This is illustrated in FIG. 5. The 4 dipoles 21, 22, 23, 24 are arranged for zero sum, but the corresponding 4 quadrupole vectors 31, 32, 33, 34 do not have a zero sum, but instead form a combined vector 100.

Figure 6:
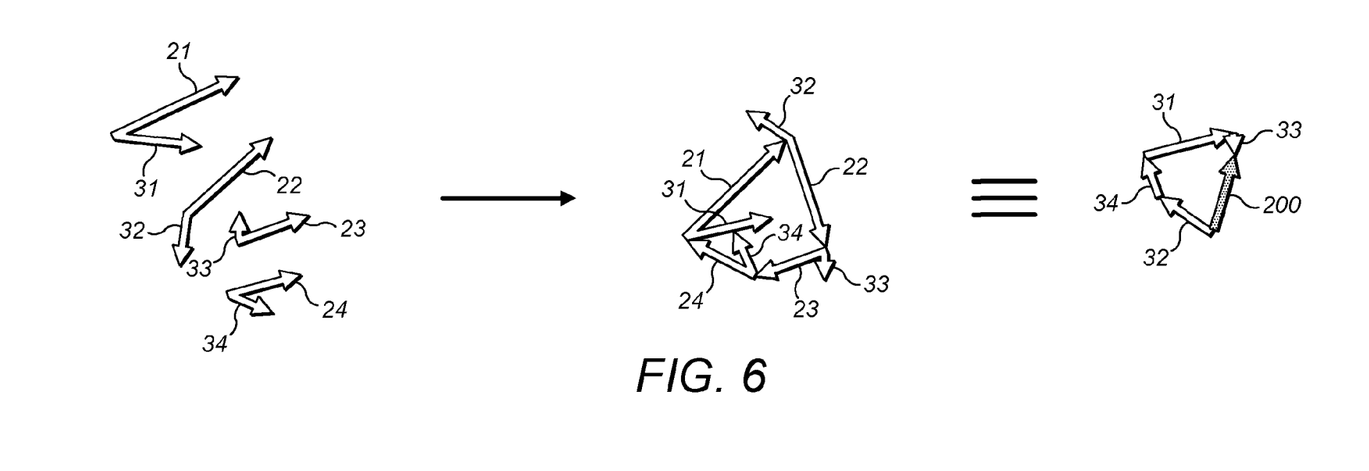
FIG. 6 is an illustration of a reduced stray transverse dipole and quadrupole moment magnetic field of a four ring magnet system.

However, because two of the magnets 12*a*, 12*b*, 12*c*, 12*d* in the rotating array 12 are required to be oriented with the North magnetic pole upwards and two with North downward. Physically inverting two of the magnets increases the number of degrees of freedom and makes the phase of the quadrupole negative with respect to the dipole compared to the non-inverted arrangement. Thus, as illustrated in FIG. 6 the total transverse field due to the magnets dipoles 21, 22, 23, 24 can be kept at zero, while reducing the total effect 200 of the quadruples 31, 32, 33, 34 by at least half.

The computer 72 calculates the relative angular orientation (compared to the reference point made on each magnet during the measurement step) and relative magnetic polarity direction of each of the four magnets 12*a*, 12*b*, 12*c*, 12*d* within the array 12 that provides the minimum time-varying stray dipole and quadrupole transverse magnetic field during rotation.

It will be apparent that it would also be advantageous to measure the stray magnetic field on a large batch of magnets, say 20, and then carry out the above calculation to determine up to five different magnet arrays, each comprising four magnets, with optimum low stray magnetic fields emissions.

The calculation can be carried out by considering the time variant fields and using the principle of superposition:

Total stray field=A+B+C+D where:

$$A=A1*COS(\theta 1+\phi 1)+A2*COS(2*\theta 1+\psi 1)$$

$$B=B1*COS(\theta 2+\phi 2)+B2*COS(2*\theta 2+\psi 2)$$

$$C=C1*COS(\theta 3+\phi 3)+C2*COS(2*\theta 3+\psi 3)$$

$$D=D1*COS(\theta+\phi 4)+D2*COS(2*\theta+\psi 4)$$

Where:

$$\theta 1=\theta+T1;\ \theta 2=\theta+T2;\ \theta 3=\theta+T3;$$

$\phi n$ and $\psi n$ are the phase angle of the dipole and quadrupole moments respectively T1, T2, and T3 are rotational adjustments which can be made to individual magnets According to the conditions mentioned, two of the pairs of $\phi n$ and $\psi n$ must be negative (to represent inverted magnets) and two positive.

The objective is to minimise the peak to peak value of A Total for $0 \leq \theta \leq 2\pi$ by varying T1, T2, T3 and the signs of the combinations of pairs of $\phi n$ and $\psi n$ The resulting output from the calculation by the computer 72 is required to indicate:

a) The order of assembly, i.e. which magnet is to occupy which position in the array 12.

b) The rotation of each magnet with respect to a reference (angular) zero.

c) The predicted stray magnetic field in nT peak-peak of the array 12

If though any of the four magnets 12*a* to 12*d* is unsuitable for use in a set, the software on the computer 72 should indicate which magnet is to be replaced with another candidate magnet and the cycle to re-start from the beginning.

Once the relative angular orientation and relative magnetic polarity direction for a set of four magnets 12*a* to 12*d* has been calculated, the array 12 can be arranged according to the calculation and the array checked on the magnet measuring station.

If this further step is carried out, the sensor axis 84 should be substantially aligned with the middle of the outer circumference of the magnet array (i.e. between magnets 12*b* and 12*c* in FIG. 1). The target time varying maximum transverse stray field measured at 200 mm from the axis for a set of four magnets is 180 nT peak-peak.

Figure 7:
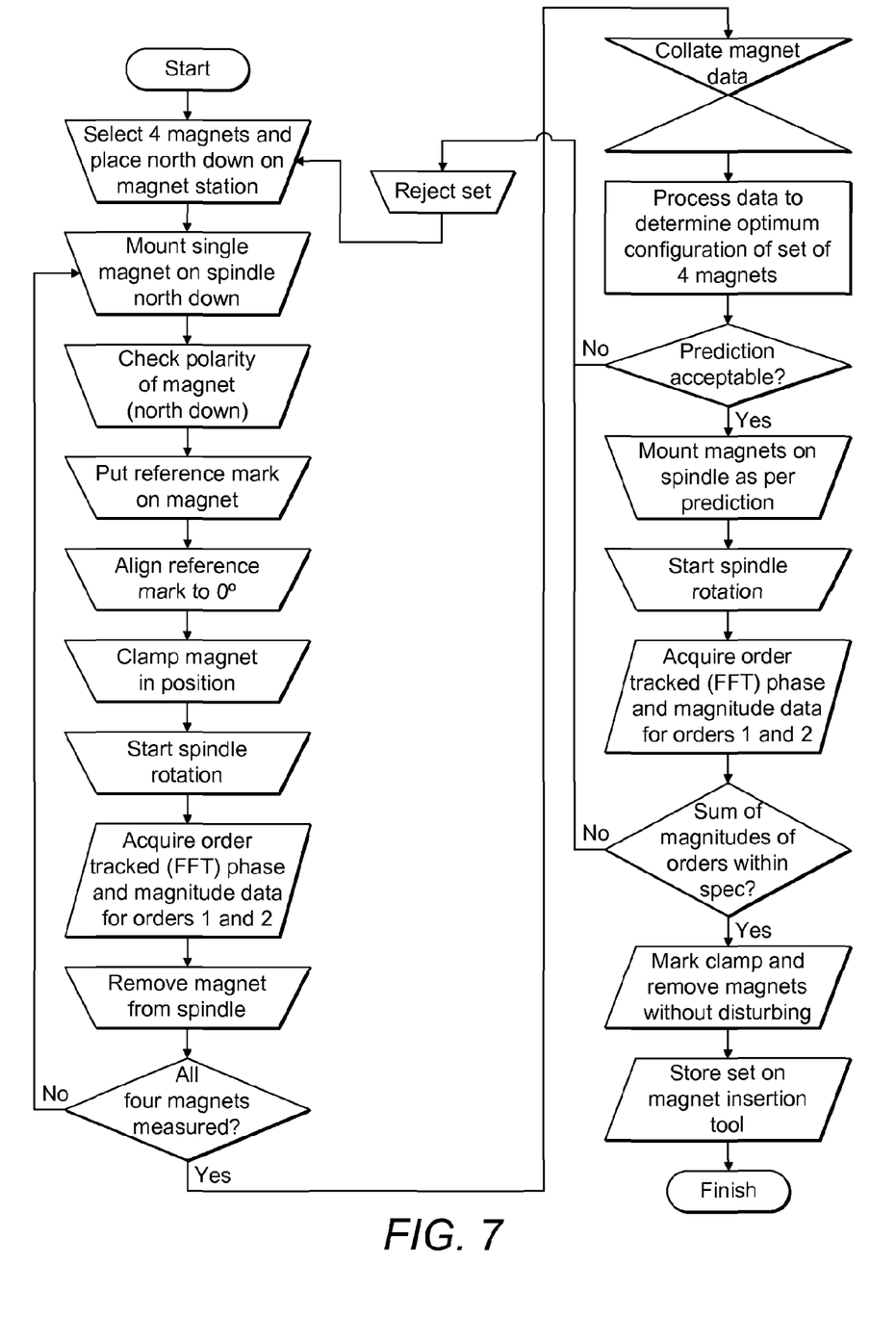
FIG. 7 is a flow diagram of a four magnet array measurement according to various embodiments.
Figure 8:
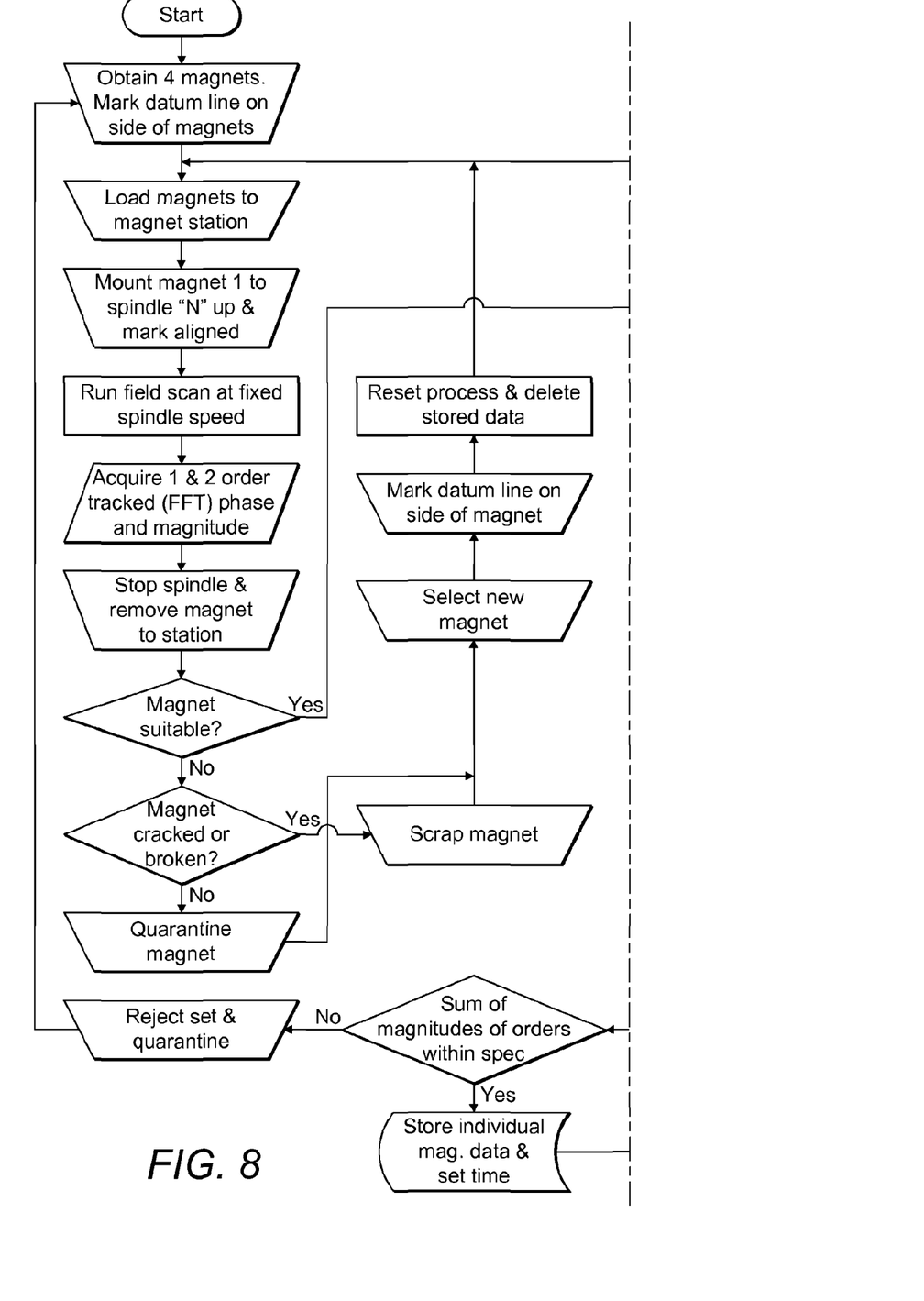
FIG. 8 is a flow diagram of a four magnet array measurement according to various embodiments.

The flow diagram for the individual magnet and array measurements is shown in FIG. 7 and FIG. 8.

The arrays 12 assembled according to the present invention can then be assembled into bearing arrangements to be fitted into a high speed rotating machine such as a turbomolecular pump.

The optimised bearing assembly may be used on its own, or combined with passive shielding or active cancellation to reduce stray fields still further.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method of assembling a rotatable permanent magnet array of a magnetic bearing arrangement, said rotating array comprising at least four permanent ring magnets, the method comprising the steps of:

measuring at least the first and second order transverse stray magnetic field vectors for each of the at least four ring magnets in relation to a reference point on the ring magnets;

calculating the relative angular orientation and relative magnetic polarity direction for each magnet within the array such that, when the at least four magnets are assembled and rotated, the time-varying magnetic field is minimised; and assembling the array of magnets according to the calculation.

2. The method of assembling a rotatable magnet array according to claim 1, comprising the additional step of measuring the first and second order transverse stray magnetic field vector of the array once assembled according to the calculation step.

3. A rotatable magnet array of a permanent magnet bearing arrangement, comprising at least four permanent ring magnets, assembled according to a method comprising:
   measuring at least the first and second order transverse stray magnetic field vectors for each of the at least four ring magnets in relation to a reference point on the ring magnets;
   calculating the relative angular orientation and relative magnetic polarity direction for each magnet within the array such that, when the at least four magnets are assembled and rotated, the time-varying magnetic field is minimized; and
   assembling the array of magnets according to the calculation.

4. A high speed rotational device comprising a bearing arrangement formed through a process comprising:
   measuring at least the first and second order transverse stray magnetic field vectors for each of at least four ring magnets in relation to a reference point on the ring magnets;
   calculating the relative angular orientation and relative magnetic polarity direction for each magnet within the array such that, when the at least four magnets are assembled and rotated, the time-varying magnetic field is minimized; and
   assembling the array of magnets according to the calculation.

5. The high speed rotational device of claim 4 wherein the high speed rotation device comprises a turbomolecular pump.

* * * * *